United States Patent [19]

Davies

[11] Patent Number: 5,283,157
[45] Date of Patent: Feb. 1, 1994

[54] DIFFUSION TRANSFER PRINTING PLATE

[75] Inventor: Paul Davies, Shoreview, Minn.

[73] Assignee: Minnesota Mining and Manufacturing Company, St. Paul, Minn.

[21] Appl. No.: 35,312

[22] Filed: Mar. 22, 1993

[51] Int. Cl.$^5$ .............................................. G03C 5/54
[52] U.S. Cl. .................... 430/204; 430/233; 430/246; 430/248; 430/251
[58] Field of Search ............... 430/204, 233, 246, 248, 430/251

[56] References Cited

U.S. PATENT DOCUMENTS

| | | | |
|---|---|---|---|
| 3,515,555 | 6/1970 | Fassbender | 96/52 |
| 3,619,186 | 11/1971 | Parsons | 96/29 |
| 3,655,380 | 4/1972 | Parsons | 430/248 |
| 4,124,390 | 11/1978 | Kohn | 96/57 |
| 4,220,702 | 9/1980 | Tsubai et al. | 430/204 |
| 4,362,811 | 12/1982 | Iguchi et al. | 430/455 |
| 4,436,805 | 3/1984 | Iguchi et al. | 430/248 |
| 4,632,896 | 12/1986 | Tsubai et al. | 430/249 |
| 4,649,096 | 3/1987 | Tsubai et al. | 430/249 |
| 5,037,727 | 8/1991 | McLaen | 430/449 |
| 5,206,115 | 4/1993 | Waki | 430/248 |

FOREIGN PATENT DOCUMENTS 1801330  4/1970  Fed. Rep. of Germany.

Primary Examiner—Richard L. Schilling
Attorney, Agent, or Firm—Gary L. Griswold; Walter N. Kirn; Mark A. Litman

[57] ABSTRACT

A method for making a lithographic printing plate which comprises the steps of A) imagewise exposing a light sensitive material which comprises a support, a negative working silver halide emulsion layer and a surface physical development nucleating layer on said support, and B) processing the exposed material in a silver complex diffusion transfer developer containing a water soluble iodide to produce a non-black oleophilic silver image on the surface of said printing plate.

11 Claims, No Drawings

DIFFUSION TRANSFER PRINTING PLATE

BACKGROUND OF THE INVENTION

1. Field of the Invention

This invention relates to a method of making a lithographic printing plate by the silver complex diffusion transfer process. In particular, this invention relates to a method of preventing image degradation of the printing plate due to deterioration of the processing chemistry.

2. Background of the Art

The present invention relates to a single sheet printing plate construction comprising a support, on which an antihalation layer, an emulsion layer and a physical nucleating receptor layer are provided. Following imagewise exposure, the plate is processed in a diffusion transfer developer. The exposed area develops out as a black silver image, while the unexposed silver halide subsequently diffuses through to the receptor element. Physical development nuclei in the receptor layer reduce the silver halide to a metallic silver complex in the presence of the toning agent 1-phenyl-5-mercaptotetrazole.

As described in various embodiments, e.g., U.S. Pat. Nos. 3,728,114, 4,160,670 and U.S. Pat. No. 4,361,635, such a process can function as a lithographic printing plate due to the oleophilic nature of the complexed silver in the receptor layer and the hydrophilic developed silver image in the emulsion layer. However, a very rapid development process is required to reduce exposed areas into non-diffusing silver images before the silver halide solvent can take effect. The greater the differentiation between the (unexposed) complexed silver and the (exposed) developed image area, the better the printing quality will be.

According to James, The Theory of The Photographic Process, 4th. Edition, Macmillan Publishing Co., New York, 1979, page 475, several factors such as silver concentration, particle size and physical development nuclei can affect the color of the transferred silver. Diffusion transfer systems such as monochrome prints, duplicating papers, block copying materials and instant photography require a neutral black, or at least a blue-black, tone. In this respect iodide is well documented as a toning agent or restrainer.

U.S. Pat. No. 3,515,555 describes a direct positive photographic paper with improved tone when processed in a solution containing an alkali metal sulfide, alkali metal hydroxide, thioamide and an alkali metal iodide.

U.S. Pat. No. 3,619,186 describes a diffusion transfer system wherein the receiving layer contains iodide. This results in a neutral tone image. The presence of iodide in the emulsion layer or developer does not have the same beneficial effect on tone.

U.S. Pat. No. 4,124,390 discloses a mordanting solution consisting of an alkaline solution of one or more complexing agents which form an insoluble silver salt complex. Potassium iodide is given as an example of a complexing adjuvant which may also be present.

U.S. Pat. No. 4,220,702 includes an example of a developer for processing a lithographic printing plate that contains potassium iodide as a restrainer for a chloroiodide emulsion. The level of iodide is significantly greater than the amount utilized in an activator for processing an emulsion, such as a chlorobromide emulsion as described in this invention.

U.S. Pat. No. 4,362,811 describes an activator solution for diffusion transfer processing that contains, in addition to the prerequisite alkali, sulfite and silver halide solvent, specific levels of potassium and bromide ions: 2.0–12.0 mole% potassium based upon the total cations of the salts in the activator and $1.7 \times 10^{-3}$ to $1.7 \times 10^{-2}$ mole/liter bromide.

DT 1,801,330 discloses the combination of 1-phenyl-5-mercaptotetrazole and potassium iodide in either the developer or image receiving layer of a diffusion transfer process. Such a combination provides black image tone and faster processing time in a peel apart duplicating paper system.

U.S. Pat. No. 4,436,805 also describes the combination of 1-phenyl-5-mercaptotetrazole and potassium iodide to achieve neutral black image tone in a two sheet peel apart diffusion transfer system. Other mercapto or thione heterocyclic nitrogen compounds are claimed in this patent.

U.S. Pat. No. 4,632,896 describes the use of aminoalcohols for processing a two sheet peel apart diffusion transfer system. Examples of solutions containing iodide are given.

U.S. Pat. No. 4,649,096 similarly describes developers for processing two sheet peel apart diffusion transfer systems, wherein examples include potassium iodide.

U.S. Pat. No. 5,037,727, though not a diffusion transfer system, claims the use of iodide in maintaining neutral image tone of activator processed black-and-white photographic prints.

SUMMARY OF THE INVENTION

This invention relates to a method of producing lithographic printing plates by the diffusion transfer process. The process describes a means for preventing deterioration of plate contrast and non-transferred image density by the use of water soluble iodide in the alkaline activator processing solution. As will be shown in the examples, once a conventional activator has been used, there is a dramatic loss of contrast and reflection density with respect to time. In the present invention it has been found that small quantities of water soluble iodide reduces this deterioration of plate quality.

Without wishing to be limited to any particular theory, it is thought that processing by-products accelerate dissolution of the silver halide, thereby increasing the degree of transfer development at the expense of image development. The presence of iodide is thought to reduce the rate of dissolution, which in turn permits complete development of the imaged areas. With a single sheet construction as described here, the density gradient between developed images and the adjacent transferred non-imaged areas is therefore increased. Since there is complete development, the density of the imaged area will also increase and tend to form non-black silver deposits which are oleophilic.

In many of the examples of the prior art described above, the utility of iodide is to increase the tone or blackness of the transferred non-imaged areas in a two sheet composition. The alkaline activator processed single sheet lithographic plate construction disclosed in this application differs from that type of prior art in that it is the exposed, and not the unexposed, areas that are black. The presence of a conventional toning agent such as 1-phenyl-5-mercaptotetrazole is designed to make the transferred non-imaged areas more oleophilic, a characteristic of which is to produce a more metallic silver (gray or shiny silvery) appearance.

With the present invention, where there is a black antihalation layer and imaged areas of developed silver, if iodide should produce a black transferred image as described in the prior art, it would result in significantly lower contrast. To the contrary, the transferred image of this invention may be any color except black and may not be black in the practice of the present invention. The color may be dark gray, gray, or silvery, or may be toned by the presence of dyes to blue-grays, and the like. The difference between the black and the non-black areas should be sufficient to be visually observable upon development. To maintain the high contrast of this lithographic plate, plus the durability and registration on press, a unitary construction is used instead of a two sheet peel apart system.

DETAILED DESCRIPTION OF THE INVENTION

This invention provides a method for making a lithographic printing plate which performs with consistent quality throughout the life of the developing solution. The process is accomplished by imagewise exposing a single sheet lithographic plate material consisting of a flexible support, having thereon at least one light sensitive silver halide layer and a physical development nucleating surface layer, and processing said plate material in an iodide containing diffusion transfer activator solution, wherein imaged portions develop out as hydrophilic areas and oleophilic areas represent the non-imaged portions of said plate material. The term "single sheet" lithographic plate material means that the support, silver halide emulsion layer, and physical development layer are not strippable from each other during the imaging and use of the lithographic plate.

The flexible support according to this invention may be paper, alpha-olefin polymer (polyethylene, polypropylene, etc.) coated paper, films such as cellulose acetate, polypropylene, polystyrene, polycarbonate, polyvinyl acetal, polyethylene terephthalate, composite films, metals, metalised paper, or metal/paper laminates.

It is preferred to to have a backside coat and at least an undercoat layer on the faceside of said support, consisting of a hydrophilic polymer, which may also contain dyes or pigments to provide anti-halation effects or impart certain physical characteristics such as low curl or colored appearance. The preferred hydrophilic polymer is gelatin, especially an inert deionized ossein type gelatin, and may be combined with hydrophilic binders such as starch, albumin, sodium alginate, hydroxyalkylcellulose, gum arabic, polyvinyl alcohol, polyvinyl pyrrolidone, carboxymethylcellulose, polyacrylamide or copolymers of styrene-maleic anhydride or polyvinyl methyl ether/maleic anhydride. The preferred anti-halation pigment in the undercoat layer is carbon black, although other dyes or pigments that absorb at the wavelength of the imaging light source may also be used.

Included in both the back-side and face-side underlayer may be coating aids such as surfactants, antistatic agents, matting agents, anti-tacking agents and hardening compounds for said hydrophilic binder.

Examples of surfactants include non-ionic surface active agents such as saponin, alkylene oxide derivatives, glycidol derivatives, fatty acid esters of polyhydric alcohols and alkyl esters of sugars, anionic surface active agents having an acidic group such as carboxyl, sulfo, phospho, sulfuric acid ester, sulphonamide or phosphoric acid ester group, cationic surface active agents such as amino acids, aminoallkylsulfonic acids, aminosulfonic or phosphoric acid esters, alkylbetaines, amine oxides, alkylamine salts, aliphatic or aromatic quaternary ammonium or phosphoric salts, heterocyclic quaternary ammonium and aliphatic or heterocyclic ring-containing phosphonium or sulfonium salts. The matting agent may include silica, colloidal silica, glass powder, polymeric particulates (e.g., polymethylmethacrylate) or starch powder.

The hardening agents may include organic and/or inorganic compounds for example: chromium or aluminum salts, aldehydes, N-methylol compounds, dioxane derivatives, active vinyl compounds such as triacryloyl-hexahydro-S-triazines or vinylsulfones, active halogen compounds such as dichlorohydroxy-S-triazines, or mucohalogenic acids.

Such examples of additives as described above may also be be utilized in the light sensitive silver halide layer.

The silver halide used in this invention may consist of silver chloride, silver bromide, silver iodide, silver chlorobromide, silver bromoiodide, silver iodobromochloride or mixtures thereof. Included in the silver halide are dopants from Group VIII of the Periodic Table, such as rhodium, ruthenium, iridium or mixtures thereof in the range of 10−3 to 10−8 mole per mole of silver. The crystalline form of the sliver halide may be monodispersed or polydispersed and may also be of the core-shell or tablet (tabular or high aspect ratio grains) type grains. The preferred embodiment of the present invention is a 0.2–0.3 micron ruthenium-iridium doped monodispersed silver chlorobromide emulsion containing at least 60% chloride.

These emulsions can be chemically sensitized by known methods, for example alone or in combination with: sulfur sensitization as described in U.S. Pat. No. 1,574,944, 2,278,947, 2,410,689, 3,189,458 or 3,501,313; gold sensitization as disclosed in U.S. Pat. No. 2,597,856, 2,597,915 or 2,399,083; reduction sensitization as described in U.S. Pat. No. 2,518,698, 2,521,925, 2,487,850 or 2,6694,637. The photographic emulsions used in the present invention may be further sensitized with quaternary ammonium or phosphonium salts, thioether compounds, polyethylene oxide derivatives or diketones as disclosed in U.S. Pat. Nos. 2,708,162, 3,046,132, 3,046,133, 3,046,134 or 3,046,135.

The photographic emulsion of the present invention may be spectrally sensitized to any wavelength in either the visible or infrared portion of the electromagnetic spectrum by methods known to those skilled in the art. Examples of spectral sensitizers used in the present invention may include cyanine, merocyanine or other sensitizing dyes.

The photographic emulsion layer may contain various compounds to prevent fogging of the light sensitive material of the present invention during preparation, storage or during processing. Such antifoggants and stabilizers may include azoles such as benzothiazolium salts, nitroindazoles, triazoles and benzimidazoles; heterocyclic mercapto compounds such as mercaptothiazoles, mercaptobenzothiazoles, mercaptobenzimidazoles, mercaptothiadiazoles or mercaptopyrimidines; thioketo compounds such as oxazolinthion; azaindenes such as tetraazindenes; benzenethiosulfonic acids or benzenesulfinic acids.

The receptor layer provided above said emulsion layer contains physical development nuclei, which may be fine particles of metals such as silver, bismuth, antimony, cadmium, cobalt, lead, nickel, palladium, rhodium, gold, platinum, iron, etc., or sulfides, polysulfides or selenides of these metals, or mixtures thereof. The receptor layer may also contain adjuvants such as binders, coating aids, antistatic compounds, hardeners, etc. similar to the examples described in the other coated layers.

As mentioned previously, to differentiate the oleophilic from hydrophilic areas of the plate material, the diffusion transfer process requires an extremely active chemistry that can fully develop out the imaged areas before the silver halide solvent can take effect. One way to increase activity is to increase the alkalinity of the chemistry. However, under such highly alkaline conditions, the developing agent and electron transfer agent may undergo rapid oxidation, thereby adversely affecting image quality and significantly reducing chemistry life. These limitations may be overcome by incorporating the developing agents into the lithographic plate, and subsequently processing in an alkaline activator solution. Developing agents may include polyhydroxybenzenes, such as hydroquinone and electron transfer agents such as 1-phenyl-3-pyrazolidone. As will be demonstrated later, an alkaline activator type system does not guarantee consistent image quality or chemistry life, but may be improved upon by the present invention.

In addition to water soluble iodide compounds of the present invention, the alkaline activating solution may also contain water soluble alkali metal hydroxides, such as sodium or potassium hydroxide; a toning or complexing agent such as a mercaptotetrazole, mercaptothiazole or mercaptothiazoline; a silver halide solvent such as thiocyanate, aminoalkanols or thiosulphate and an antioxidant such as sodium or potassium sulfite. The solution may also contain developing agents like hydroquinone and electron transfer agents such as 1-phenyl-3-pyrazolidone, though it is also known to incorporate such compounds into the silver halide emulsion or other coated layers and process the diffusion transfer element in an activator bath, as described in U.S. Pat. No. 4,362,811. Other additives may include development accelerators such as polyoxyalkylenes or quaternary ammonium salts, antifoggants such as potassium bromide and thickening agents such as carboxymethylcellulose.

The following non-limiting examples further illustrate this invention.

EXAMPLE 1

A lithographic printing plate was made by coating on a clear gel subbed 4 mil(0.1mm) polyester support: an underlayer consisting of an aqueous carbon black dispersion in deionized inert ossein gelatin, containing hydroquinone, phenidone, silica and formaldehyde; a ruthenium/iridium doped 75:25 % silver chlorobromide emulsion sensitized to 633 nm., having an average grain size of 0.3 microns and coated at 0.7 g/m$^2$ silver; a top coat containing palladium sol, various coating aids and a dialdehyde starch.

Three ft$^2$ of the plate material was then imagewise exposed on a Linotronic L-300 imagesetter and processed in a one gallon capacity 3M brand 1144 plate processor containing an alkaline activator solution and 3M Onyx TM Stabilizer. The composition of the alkaline activator solution is given below:

| | |
|---|---|
| Sodium sulfite | 42.5 grams |
| Potassium hydroxide | 40.0 grams |
| Sodium thiocyanate | 12.0 grams |
| Trisodium phosphate | 0.2 grams |
| Benzotriazole | 0.8 grams |
| 1-phenyl-5-mercaptotetrazole | 0.1 2 grams |
| Water to 1 Kg. | |

Sensitometric response was evaluated by exposing the plate to a 633 nm. HeNe laser at 2 MJ/m2 through a 0-3 density continuous tone wedge, processing as above and measuring the density gradient on a computerized reflection densitometer. Speed 1 and speed 2 are relative logE values measured at 0.2 and 0.8 of density above Dmin respectively. Contrast values were taken as the gradient between these two speed points.

This process was then repeated at 3 and 6 day intervals in the same activator. Between sampling, the activator was sealed to prevent evaporation and loss of alkalinity due to carbon dioxide absorption. As noted from the sensitometric results listed in Table 1, there is a progressive loss of contrast with age.

TABLE 1

| Day | Dmin | Dmax | Speed #1 | Speed #2 | Contrast |
|---|---|---|---|---|---|
| 0 | 0.540 | 1.33 | 1.47 | 1.03 | 1.09 |
| 3 | 0.555 | 1.35 | 1.52 | 0.88 | 0.76 |
| 6 | 0.551 | 1.30 | 1.40 | 0.86 | 0.82 |

Processing the chlorobromide emulsion described above will contribute chloride and bromide to the alkaline activator. Since these halides are known to affect development rate, it was necessary to differentiate the effect each halide may have on the diffusion transfer process.

EXAMPLE 2

In order to confirm that the stabilizing effect was due to iodide, rather than the chloride or bromide that elutes from processed plate material, samples of the activator solution used in Example 1 were prepared with additional amounts of the following halides:

| Sample | ppm Halide |
|---|---|
| A | None (Control) |
| B | 48 ppm chloride |
| C | 77 ppm bromide |
| D | 150 ppm iodide |

Over a 28 day period a total of twelve 25×3.5 cm. strips of the above described chlorobromide plate material were tray processed in 250 cubic centimeters of each activator. Consequently, the resulting halide level in Sample B would correspond to ppm. chloride, Sample C would equal 150 ppm bromide and Sample D, 150 ppm iodide. To eliminate the possibility that the control could be confounded by a build-up of bromide and chloride, fresh samples of A i? were used as controls throughout the 28 day experiment. As in the previous example, all activators were stored in sealed containers between sampling to prevent evaporation and carbon dioxide absorption.

Sensitometric responses are listed in Table 2.

TABLE 2

| Sample | | Dmin | Dmax | Speed #1 | Speed #2 | Contrast |
|---|---|---|---|---|---|---|
| A | Day 0 | 0.544 | 1.35 | 1.44 | 1.01 | 1.11 |
| | Day 14 | 0.544 | 1.33 | 1.44 | 1.00 | 1.08 |
| | Day 21 | 0.554 | 1.34 | 1.44 | 1.02 | 1.11 |
| | Day 28 | 0.581 | 1.35 | 1.45 | 0.99 | 1.00 |
| B | Day 0 | 0.536 | 1.34 | 1.38 | 0.95 | 1.12 |
| | Day 3 | 0.544 | 1.36 | 1.40 | 0.91 | 0.98 |
| | Day 7 | 0.541 | 1.32 | 1.35 | 0.68 | 0.69 |
| | Day 14 | 0.531 | 1.29 | 1.41 | 0.87 | 0.86 |
| | Day 21 | 0.526 | 1.23 | 1.41 | 0.79 | 0.71 |
| | Day 28 | 0.537 | 1.07 | 1.31 | 0.45 | 0.37 |
| C | Day 0 | 0.534 | 1.34 | 1.44 | 1.03 | 1.18 |
| | Day 3 | 0.552 | 1.36 | 1.36 | 0.89 | 1.02 |
| | Day 7 | 0.530 | 1.29 | 1.38 | 0.87 | 0.90 |
| | Day 14 | 0.544 | 1.31 | 1.38 | 0.71 | 0.69 |
| | Day 21 | 0.539 | 1.27 | 1.38 | 0.76 | 0.71 |
| | Day 28 | 0.560 | 1.16 | 1.35 | 0.54 | 0.45 |
| D | Day 0 | 0.532 | 1.37 | 1.47 | 1.07 | 1.26 |
| | Day 3 | 0.559 | 1.39 | 1.53 | 1.13 | 1.24 |
| | Day 7 | 0.510 | 1.36 | 1.47 | 1.04 | 1.19 |
| | Day 14 | 0.521 | 1.36 | 1.50 | 1.13 | 1.34 |
| | Day 21 | 0.517 | 1.34 | 1.47 | 1.02 | 1.10 |
| | Day 28 | 0.550 | 1.34 | 1.44 | 0.95 | 0.96 |

Comparing the sensitometric response of the iodide activator with the bromide and chloride samples, there is minimal loss of density and contrast over the one month period.

Since the quality of the printing plate is a function of the transferred image, which in turn is related to the transfer development rate, press tests were conducted on the above samples. Of particular interest are: the minimum number of copies before complete inking is achieved, referred to as roll-up; the minimum number of copies, known as press wear; and the propensity of the plate to take ink in the hydrophilic areas, which is called scumming. Running 2,000 impressions on a Heidelberg GTO offset press using a black oil based ink showed no difference in printing characteristics produced on the plates when comparing the iodide activator and the other chemistries.

EXAMPLE 3

A series of activators as described in Example 1 were prepared with a range of zero up to 2,000 ppm potassium iodide. Samples of plate material were evaluated for sensitometric response on the HeNe laser as detailed in the previous example.

TABLE 3

| ppmKI | Dmin | Dmax | Speed #1 | Speed #2 | Contrast |
|---|---|---|---|---|---|
| 0 | 0.550 | 1.34 | 1.47 | 1.03 | 1.09 |
| 80 | 0.552 | 1.36 | 1.49 | 1.10 | 1.25 |
| 160 | 0.534 | 1.36 | 1.50 | 1.09 | 1.21 |
| 200 | 0.532 | 1.36 | 1.50 | 1.09 | 1.24 |
| 240 | 0.529 | 1.36 | 1.51 | 1.08 | 1.18 |
| 320 | 0.566 | 1.38 | 1.52 | 1.08 | 1.10 |
| 400 | 0.552 | 1.36 | 1.53 | 1.03 | 0.99 |
| 600 | 0.577 | 1.37 | 1.56 | 1.01 | 0.86 |
| 800 | 0.620 | 1.39 | 1.60 | 1.03 | 0.80 |
| 1200 | 0.692 | 1.39 | 1.52 | 0.94 | 0.71 |
| 1600 | 0.768 | 1.39 | 1.56 | 0.93 | 0.59 |
| 2000 | 0.872 | 1.38 | 1.51 | 0.94 | 0.55 |

The useful range of potassium iodide is between 25 and 400, and preferably between 80 and 400 ppm, with an optimum level of approximately 200 ppm KI. Press tests on the Heidelberg GTO offset press indicated a small loss of resolution at 400 ppm. and a slight loss of ink density beyond 600 ppm. KI.

EXAMPLE 4

A sample of chemistry, depleted after processing 900 ft2/gallon of the plate material over a period of several days, was regenerated by adding successive quantities of potassium iodide. HeNe laser sensitometry was evaluated as outlined in Example 1 and the results listed in Table 4.

TABLE 4

| ppmKI | Dmin | Dmax | Speed #1 | Speed #2 | Contrast |
|---|---|---|---|---|---|
| 0 | 0.670 | 1.31 | 1.54 | 0.95 | 0.67 |
| 200 | 0.609 | 1.32 | 1.52 | 1.03 | 0.86 |
| 400 | 0.578 | 1.32 | 1.56 | 1.08 | 0.93 |
| 600 | 0.541 | 1.33 | 1.56 | 1.06 | 0.95 |
| 800 | 0.543 | 1.32 | 1.67 | 1.07 | 0.94 |
| 1200 | 0.557 | 1.32 | 1.59 | 1.08 | 0.89 |
| 1600 | 0.582 | 1.35 | 1.60 | 1.10 | 0.93 |
| 2000 | 0.618 | 1.36 | 1.60 | 1.13 | 0.95 |
| 3000 | 0.803 | 1.36 | 1.70 | 1.12 | 0.58 |
| 4000 | 0.975 | 1.36 | 1.76 | 1.03 | 0.32 |

Although it was not possible to bring the exhausted chemistry back to its original activity, substantial improvements were made in reducing fog and increasing the contrast of the control strips. Whereas the optimum level of potassium iodide in fresh activator was determined to be around 200 ppm., this quantity has to be increased three-fold to produce the best sensitometric response of the plate material in depleted chemistry. As in Example 3, press tests on the Heidelberg GTO offset press showed a progressive loss of ink density above 600 ppm. KI.

What is claimed is:

1. A method for making a lithographic printing plate that comprises the steps of:
   (a) imagewise exposing a unitary light sensitive material which consists of a support, at least one negative working light sensitive silver halide emulsion layer comprising a hydrophilic gelatin layer and a surface physical development nucleating layer;
   (b) processing said plate material in a diffusion transfer alkaline activator solution to provide a transferred oleophilic non-black silver complex and a non-transferred black image in the hydrophilic gelatin layer;
   (c) said fusion transfer alkaline activator comprising at least an alkali metal hydroxide, a silver halide solvent, a silver complexing agent and a water soluble iodide present as 25 to 500 ppm. in said activator solution.

2. The method of claim 1, wherein the water soluble iodide is in the range of 25 to 400 ppm. in said activator solution.

3. The method of claim 1, wherein the silver complexing agent is selected from the group consisting of a mercaptotetrazole, a mercaptotetrazole or a mercaptothiazoline.

4. The method of claim 1, wherein the silver halide solvent is selected from the group consisting of an aminoalkanol, alkali metal thiocyanate or alkali metal thiosulfate.

5. The method of claim 1, wherein said activator solution contains at least one more additive selected from the group consisting of preservatives, sequestering agents, antifoggants and developer modifiers.

6. The process of claim 1, wherein said silver halide emulsion comprises at least some bromide.

7. The process of claim 1 wherein the oleophilic areas produced are gray to silvery in color.

8. The process of claim 1 wherein the oleophilic areas produced on said plate are silver in color.

9. The process of claim 7 wherein said oleophilic areas are shiny.

10. The process of claim 8 wherein said oleophilic areas on said plate are shiny.

11. The process of claim 1 wherein the black and non-black areas formed by processing may be distinguished visually from each other.

* * * * *

UNITED STATES PATENT AND TRADEMARK OFFICE
CERTIFICATE OF CORRECTION

PATENT NO. : 5,283,157
DATED : February 1, 1994
INVENTOR(S) : Davies

It is certified that error appears in the above-indentified patent and that said Letters Patent is hereby corrected as shown below:

Column 4, line 42, delete "2,6694,637"
and insert --2,694,637--.
Column 6, line 58, delete "to ppm."
and insert --to 150 ppm.--.
Column 6, line 63, delete "A i?"
and insert --A--.

Signed and Sealed this

Seventeenth Day of January, 1995

Attest:

BRUCE LEHMAN

Attesting Officer

Commissioner of Patents and Trademarks